(12) United States Patent
Wang et al.

(10) Patent No.: US 10,177,067 B2
(45) Date of Patent: Jan. 8, 2019

(54) MANUFACTURING METHOD OF PACKAGE CARRIER

(71) Applicant: Subtron Technology Co., Ltd., Hsinchu County (TW)

(72) Inventors: Chin-Sheng Wang, Hsinchu County (TW); Chih-Hsien Cheng, Hsinchu County (TW); Shih-Hao Sun, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 0 days.

(21) Appl. No.: 15/598,324

(22) Filed: May 18, 2017

(65) Prior Publication Data

US 2018/0114739 A1  Apr. 26, 2018

(30) Foreign Application Priority Data

Oct. 25, 2016 (TW) .............................. 105134391 A

(51) Int. Cl.
H01L 21/48 (2006.01)
H01L 23/00 (2006.01)
(Continued)

(52) U.S. Cl.
CPC ........ H01L 23/3675 (2013.01); H01L 21/486 (2013.01); H01L 21/4857 (2013.01);
(Continued)

(58) Field of Classification Search
CPC ............. H01L 21/486; H01L 23/49838; H01L 21/4857; H01L 24/49; H01L 23/49822;
(Continued)

(56) References Cited

U.S. PATENT DOCUMENTS 8,441,121 B2 * 5/2013 Sun ..................... H01L 23/3677
257/707
9,030,005 B2 * 5/2015 Moriya ............... H01L 23/3735
257/717
(Continued)

FOREIGN PATENT DOCUMENTS

JP    H04124899    4/1992
JP    2016025143   2/2016
JP    2016111319   6/2016

OTHER PUBLICATIONS

"Office Action of Japan Counterpart Application," dated Apr. 17, 2018, p. 1-p. 3.

Primary Examiner — Jasmine Clark
(74) Attorney, Agent, or Firm — JCIPRNET

(57) ABSTRACT

A manufacturing method including following steps is provided. A substrate that includes a core layer, a first conductive layer, and a second conductive layer is provided. A heat conducting channel is formed in the substrate, and an adhesion layer is formed on the second conductive layer to cover a side of the heat conducting channel. A heat conducting element and a buffer layer are placed into the heat conducting channel, and a gap is formed between either the heat conducting element or the buffer layer and an inner side surface of the heat conducting channel. The gap is filled with a first insulant material, and the adhesion layer and the buffer layer are removed to form a cavity and expose the heat conducting element. The first conductive layer and the second conductive layer are patterned to form a first patterned circuit layer and a second patterned circuit layer, respectively.

13 Claims, 9 Drawing Sheets

(51) Int. Cl.
*H01L 23/367* (2006.01)
*H01L 23/498* (2006.01)

(52) U.S. Cl.
CPC .... *H01L 21/4882* (2013.01); *H01L 23/49822* (2013.01); *H01L 23/49827* (2013.01); *H01L 23/49838* (2013.01); *H01L 23/49866* (2013.01); *H01L 24/49* (2013.01); *H01L 2224/48091* (2013.01); *H01L 2924/15153* (2013.01)

(58) Field of Classification Search
CPC ........... H01L 23/49827; H01L 23/3677; H01L 21/764; H01L 23/3675; H01L 23/49866; H01L 2224/48091; H01L 21/4882; H01L 21/4885
See application file for complete search history.

(56) References Cited

U.S. PATENT DOCUMENTS

| | | | |
|---|---|---|---|
| 9,870,931 B2* | 1/2018 | Wang | H01L 21/6835 |
| 2003/0100197 A1 | 5/2003 | Veitschegger et al. | |
| 2010/0059876 A1* | 3/2010 | Shimizu | H01L 23/5389 257/700 |
| 2015/0155256 A1* | 6/2015 | Lin | H01L 24/81 257/737 |
| 2016/0021753 A1 | 1/2016 | Tomikawa et al. | |

* cited by examiner

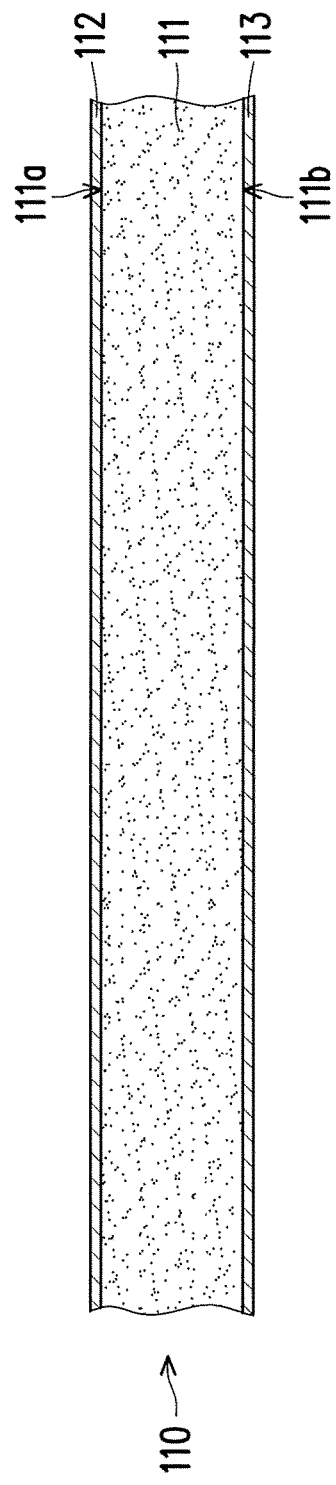
FIG. 1
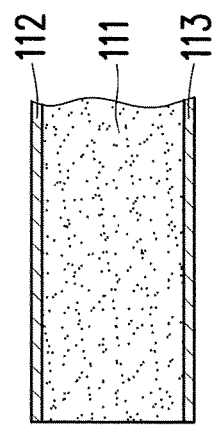
FIG. 2
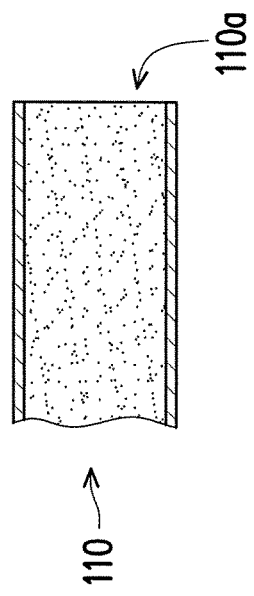

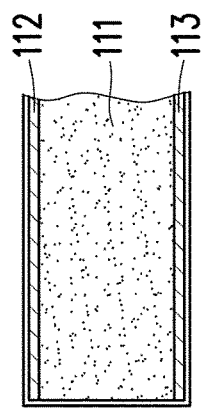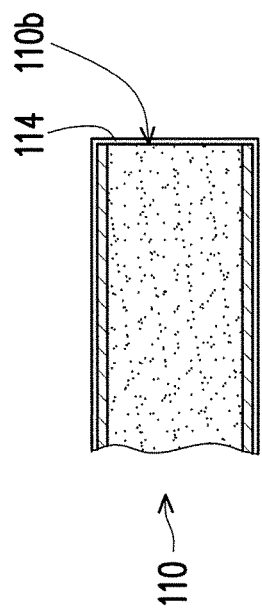
FIG. 3
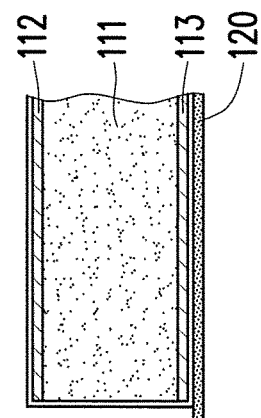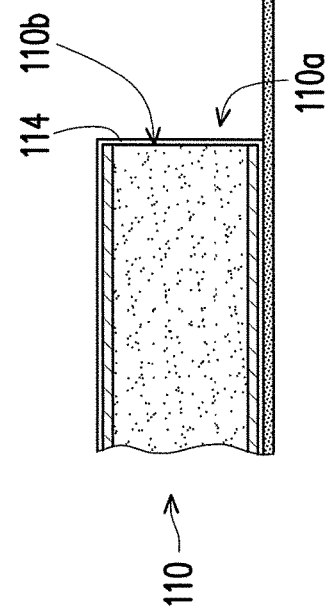
FIG. 4

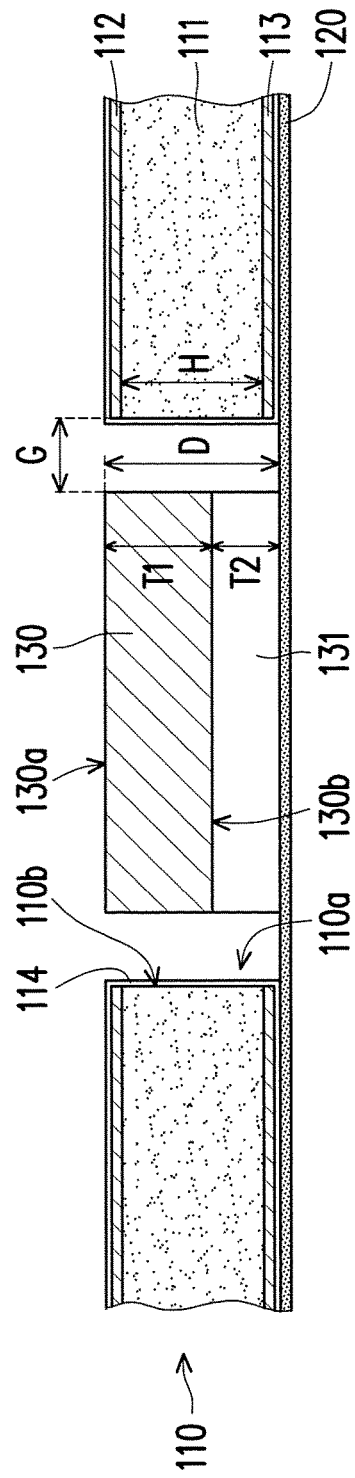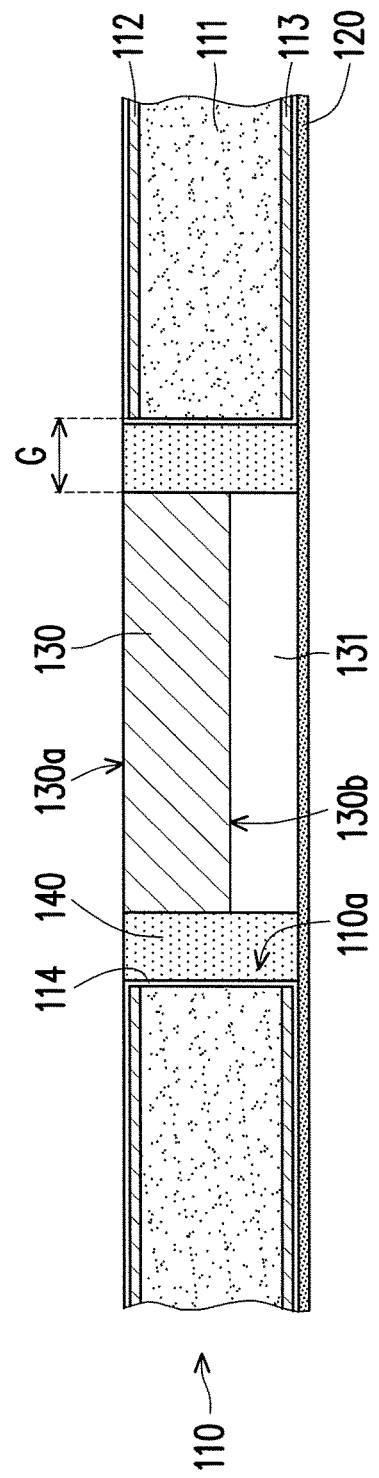

MANUFACTURING METHOD OF PACKAGE CARRIER

CROSS-REFERENCE TO RELATED APPLICATION

This application claims the priority benefit of Taiwan application serial no. 105134391, filed on Oct. 25, 2016. The entirety of the above-mentioned patent application is hereby incorporated by reference herein and made a part of this specification.

FIELD OF THE INVENTION

The invention relates to a carrier structure and a manufacturing method thereof, and more particularly relates to a package carrier and a manufacturing method thereof.

DESCRIPTION OF RELATED ART

Generally, a package carrier is constituted by at least two patterned circuit layers and at least one core layer, and the at least two patterned circuit layers are respectively located on two opposite sides of the at least one core layer. An electronic device (e.g., a chip) is mostly located on an upper surface of the package carrier. The heat generated during the operation of the electronic device may pose a negative impact on the performance of the electronic device. To enhance the heat dissipating effects of the package carrier, heat dissipating blocks are often disposed on a lower surface of the package carrier, such that the heat generated by the electronic device may be transmitted to the heat dissipating block through the patterned circuit layers and the core layer and may then be guided out. However, due to the unfavorable heat conducting efficiency of the core layer, the heat may not be easily dissipated because of the increase in the thermal resistance when the heat generated by the electronic device is transmitted to the heat dissipating blocks through the core layer. In addition, the arrangement of the heat dissipating blocks on the lower surface of the package carrier leads to the increase in the overall thickness of the package carrier, such that the resultant package carrier cannot comply with the requirements for compactness and light weight.

To reduce the overall thickness of the package carrier, the heat dissipating blocks are embedded in the core layer according to the related art. Some materials are then removed by laser or through mechanical processing, and a cavity capable of accommodating the electronic device is formed, such that the total thickness of the package can be reduced. However, the depth and the flatness of the cavity cannot be accurately controlled in the process of removing some materials by laser or through mechanical processing; that is, the manufacturing process is difficult. What is more, inadvertence may immediately bring about damages to the heat dissipating blocks and the semi-finished product.

SUMMARY OF THE INVENTION

The invention provides a package carrier that complies with the design requirements for compactness and light weight and achieves favorable heat dissipating effects.

The invention provides a manufacturing method of a package carrier which can ensure satisfactory processing precision, improve the production efficiency, and reduce the production costs.

In an embodiment of the invention, a manufacturing method of a package carrier includes following steps. A substrate is provided. The substrate includes a core layer, a first conductive layer, and a second conductive layer. The first conductive layer and the second conductive layer are respectively disposed on two opposite sides of the core layer, and the core layer has a first thickness. A heat conducting channel passing through the substrate is formed. An adhesion layer is formed on the second conductive layer, and the adhesion layer covers a side of the heat conducting channel. A heat conducting element and a buffer layer connected to the heat conducting element are placed into the heat conducting channel. Here, the buffer layer and the adhesion layer are in contact with each other, and a gap is between the heat conducting element and an inner side surface of the core layer in the heat conducting channel and between the buffer layer and the inner side surface of the core layer in the heat conducting channel. The heat conducting element has a second thickness that is less than the first thickness. The gap is filled with a first insulation material surrounding the heat conducting element and the adhesion layer. The adhesion layer and the buffer layer are removed to form a cavity and expose the heat conducting element. The first conductive layer and the second conductive layer are patterned to respectively form a first patterned circuit layer and a second patterned circuit layer.

According to an embodiment of the invention, after forming the heat conducting channel passing through the substrate, the manufacturing method further includes forming a third conductive layer on the inner side surface of the heat conducting channel, and the third conductive layer is connected to the first conductive layer and the second conductive layer.

According to an embodiment of the invention, after removing the adhesion layer and the buffer layer, forming the cavity, and exposing the heat conducting element, the manufacturing method further includes forming a first copper capping layer and a second copper capping layer on two opposite sides of the substrate.

According to an embodiment of the invention, the heat conducting element has a first surface and a second surface facing each other. The first surface and the first conductive layer are located at the same side, and the first copper capping layer at least covers the first surface and the first conductive layer. The second surface is exposed by the cavity. The second surface and the second conductive layer are located at the same side, and the second copper capping layer at least covers the second surface and the second conductive layer.

According to an embodiment of the invention, the manufacturing method further includes forming at least one conductive through hole passing through the substrate, wherein the step of forming the at least one conductive through hole passing through the substrate includes forming at least one via hole passing through the substrate. A fourth conductive layer is formed on an inner side surface of the at least one via hole and is connected to the first conductive layer and the second conductive layer. The at least one via hole is filled with a second insulation material, and the fourth conductive layer surrounds the second insulation material.

According to an embodiment of the invention, after forming the at least one conductive through hole passing through the substrate, the manufacturing method further includes forming a third copper capping layer and a fourth copper capping layer on the two opposite sides of the substrate. The third copper capping layer at least covers the first conductive layer and one end portion of the second insulation material, and the fourth copper capping layer at least covers the second conductive layer and the other end portion of the second insulation material.

According to an embodiment of the invention, after patterning the first conductive layer and the second conductive layer to respectively form the first patterned circuit layer and the second patterned circuit layer, the manufacturing method further includes respectively forming a first solder resist layer and a second solder resist layer on a portion of the first patterned circuit layer and a portion of the second patterned circuit layer.

According to an embodiment of the invention, the first solder resist layer covers the core layer exposed by the first patterned circuit layer, and the second solder resist layer covers the core layer exposed by the second patterned circuit layer.

According to an embodiment of the invention, a sum of a thickness of the heat conducting element and a thickness of the buffer layer is greater than or equal to a depth of the heat conducting channel.

According to an embodiment of the invention, a material of the heat conducting element includes ceramics, silicon, silicon carbide, diamond-like carbon, metal, or a combination thereof.

According to an embodiment of the invention, after patterning the first conductive layer and the second conductive layer to respectively form the first patterned circuit layer and the second patterned circuit layer, the manufacturing method further includes forming a first surface treatment layer and a second surface treatment layer on a portion of the first patterned circuit layer and a portion of the second patterned circuit layer.

According to an embodiment of the invention, the heat conducting element includes at least two heat conducting layers stacked with each other, and the two heat conducting layers are made of different materials.

According to an embodiment of the invention, before patterning the first conductive layer and the second conductive layer to respectively form the first patterned circuit layer and the second patterned circuit layer, the manufacturing method further includes forming at least one conductive through hole passing through the substrate.

In an embodiment of the invention, a package carrier at least including a core layer, a first patterned circuit layer, a second patterned circuit layer, a heat conducting element, and an insulation material is provided. The core layer has a heat conducting channel. Besides, the core layer has a first thickness. The first patterned circuit layer and the second patterned circuit layer are respectively disposed on two opposite sides of the core layer. The heat conducting element is placed into the heat conducting channel, and a gap is between the heat conducting element and an inner side surface of the core layer in the heat conducting channel. The heat conducting element has a second thickness that is less than the first thickness. The gap between the heat conducting element and the core layer is filled with the insulation material. Here, the insulation material surrounds the heat conducting element, and a cavity exposing the heat conducting element is defined by the heat conducting element and the insulation material.

In light of the foregoing, during the process of fixing the heat conducting element into the heat conducting channel, the buffer layer connected to the heat conducting element can be removed while tearing away the adhesion layer, such that the cavity being not filled by the first insulation material is left in the heat conducting channel. That is, while the cavity is being formed, it is not necessary to remove some materials by laser or through mechanical processing, and thus the depth and the flatness of the resultant cavity can be accurately controlled. As such, the manufacturing method of the package carrier provided herein can ensure satisfactory processing precision, improve the production efficiency, and reduce the production costs. In another aspect, the package carrier may be configured to hold the electronic device (e.g., a chip), and the electronic device is fixed in the cavity and is in direct or indirect contact with the heat conducting element. Therefore, the overall thickness of the package structure having the electronic device and the package carrier can be reduced, and the heat generated during the operation of the electronic device can be rapidly dissipated from the package structure through the second patterned circuit layer, the heat conducting element, and the first patterned circuit layer, thus achieving favorable heat dissipating effects.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 1 to FIG. 14 are schematic cross-sectional views of a manufacturing method of a package carrier according to an embodiment of the invention.

DESCRIPTION OF EMBODIMENTS

Figure 7:
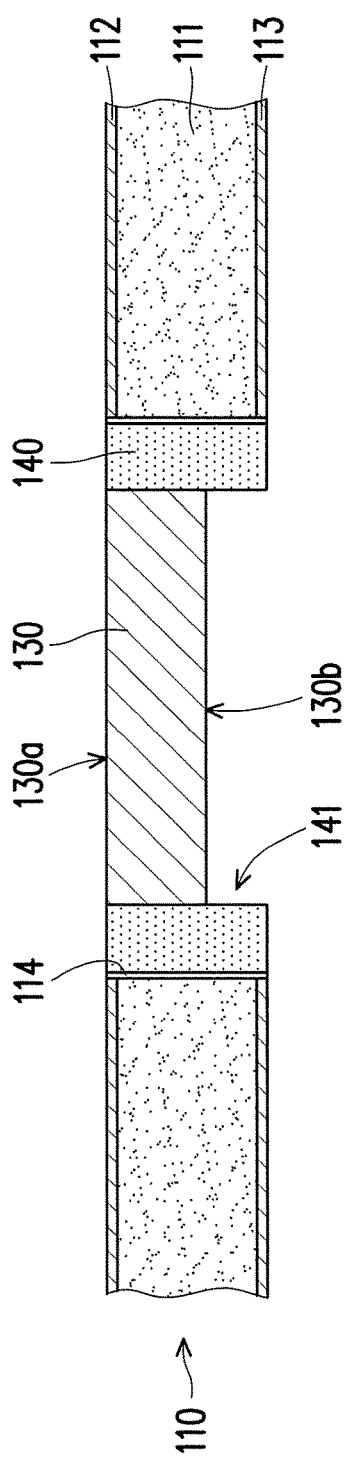

FIG. 1 to FIG. 14 are schematic cross-sectional views of a manufacturing method of a package carrier according to an embodiment of the invention. With reference to FIG. 1, a substrate 110 is provided, and the substrate 110 includes a core layer 111, a first conductive layer 112, and a second conductive layer 113. The first conductive layer 112 and the second conductive layer 113 are respectively disposed on two opposite sides of the core layer 111. In general, the first conductive layer 112 and the second conductive layer 113 may be conductive thin layers constituted by copper, aluminum, gold, nickel, other metallic materials, or alloy, and the first conductive layer 112 and the second conductive layer 113 respectively cover a first surface 111a of the core layer 111 and a second surface 111b of the core layer 111 opposite to the first surface 111a. According to the present embodiment, the core layer 111 is, for instance, a dielectric layer or a single-layer, double-layer, or multi-layer circuit board. In the present embodiment, the substrate is equipped with two conductive layers, which should however not be construed as a limitation to the invention. In other embodiments of the invention, the substrate may have the circuit board constituted by one conductive layer or at least three conductive layers.

With reference to FIG. 2, a portion of the core layer 111, the first conductive layer 112, and the second conductive layer 113 may be removed by laser, through mechanical processing, or in a different manner, so as to form a heat conducting channel 110a passing through the substrate 110. With reference to FIG. 3, a third conductive layer 114 may be formed in an inner side surface 111b of the core layer 111 in the heat conducting channel 110a through electroplating, deposition, or the like. Here, the third conductive layer 114 is connected to the first conductive layer 112 and the second conductive layer 113. According to the present embodiment, the third conductive layer 114 may further cover the first conductive layer 112 and the second conductive layer 113 and may be made of copper, aluminum, gold, nickel, other metallic materials, or alloy.

With reference to FIG. 4, an adhesion layer 120 is formed on the second conductive layer 113, and the adhesion layer 120 covers a side of the heat conducting channel 110a. Specifically, the adhesion layer 120 may be an adhesive tape of which the adhesive surface is temporarily adhered to one side of the substrate 110, and the adhesion layer 120 serves as a support film layer of components which are subsequently placed into the heat conducting channel 110a. The second conductive layer 113 provided in the present embodiment is covered by the third conductive layer 114, for instance; hence, the adhesion layer 120 is substantially adhered to the third conductive layer 114. With reference to FIG. 5, the heat conducting element 130 and the buffer layer 131 connected to the heat conducting element 130 are placed into the heat conducting channel 110a, and the buffer layer 131 faces the adhesion layer 120. Hence, after the heat conducting element 130 and the buffer layer 131 are placed into the heat conducting channel 110a, the buffer layer 131 may be adhered to the adhesion layer 120, so as to fix the locations of the heat conducting element 130 and the buffer layer 131 in the heat conducting channel 110a. The heat conducting element 130 may be made of materials including ceramics, silicon, silicon carbide, diamond-like carbon, metal, or a combination thereof.

In the present embodiment, the buffer layer 131 may be rubber, silica gel, plastic, or any other appropriate material. The buffer layer 131 is, for instance, temporarily adhered to the second surface 130b of the heat conducting element 130 through an adhesion layer (not shown). As indicated in FIG. 5, a gap G is between the heat conducting element 130 and the inner side surface 110b of the core layer 111 in the heat conducting channel 110a and between the buffer layer 131 and the inner side surface 110b of the core layer 111 in the heat conducting channel 110a, and the heat conducting element 130 and the buffer layer 131 are not in contact with the third conductive layer 114 formed on the inner side wall 110b. A thickness T1 of the heat conducting element 130 is less than a thickness H of the core layer 111, which is conducive to the subsequent formation of the required cavity. For instance, the thickness T1 of the heat conducting element 130 is 0.1-0.9 times the thickness H of the core layer 111; however, the invention is not limited thereto. On the other hand, the thickness T1 of the heat conducting element 130 may be greater than the thickness T2 of the buffer layer 131, and a ratio of the thickness T1 to the thickness T2 is around 2:1, which should however not be construed as limitations to the invention. The sum of the thickness T1 of the heat conducting element 130 and the thickness T2 of the buffer layer 131 may be greater than or equal to the depth D of the heat conducting channel 110a and may be greater than or equal to the thickness H of the core layer 111. Hence, after the heat conducting element 130 and the buffer layer 131 are placed into the heat conducting channel 110a and fixed onto the adhesion layer 120, the first surface 130a of the heat conducting element 130 exposed by the heat conducting channel 110a may be substantially co-planar with or horizontally higher than the first surface 111a of the core layer 111.

With reference to FIG. 6, the gap G is filled with a first insulation material 140 surrounding the heat conducting element 130 and the buffer layer 131. The first insulation material 140 may be epoxy resin or any other appropriate material and may be mixed with heat conducting particles for enhancing the heat dissipating effects. After the first insulation material 140 is cured and shaped, the heat conducting element 130 can be secured into the heat conducting channel 110a. With reference to FIG. 7, the adhesion layer 120 and the buffer layer 131 are removed, such that the first insulation material 140 defines the cavity 141 and exposes the second surface 130b of a portion of the heat conducting element 130. The viscosity of the adhesion layer (not shown) fixing the buffer layer 130 and the heat conducting element 130 is less than the viscosity of the adhesion layer 120, for instance; hence, while the adhesion layer 120 is torn away, the buffer layer 131 is preferably adhered to the adhesion layer 120 and separated from the second surface 130b of the heat conducting element 130. A cleansing process may be selectively performed subsequently to clean the residues of the buffer layer 131. The third conductive layer 114 on the first conductive layer 112 and on the second conductive layer 113 may then be selectively removed through polishing.

Figure 8:
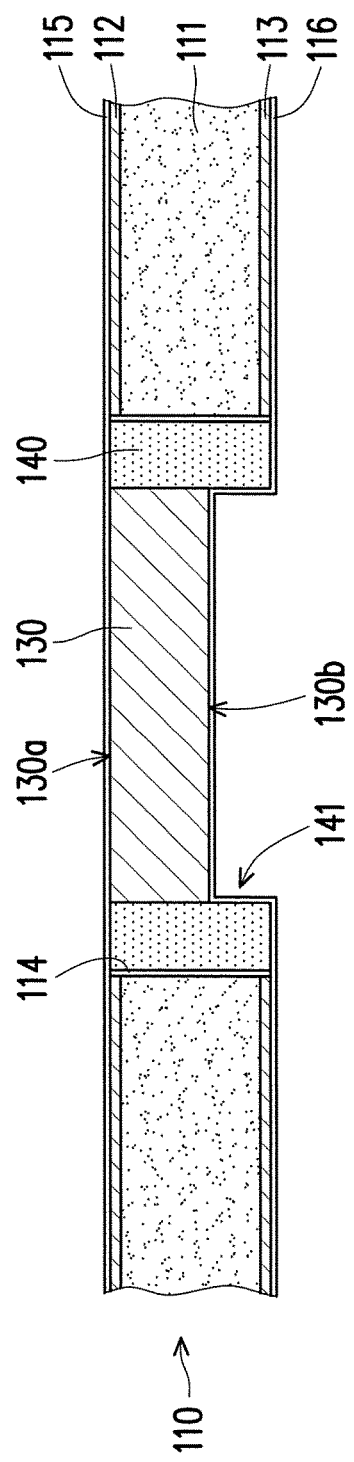
Figure 9:
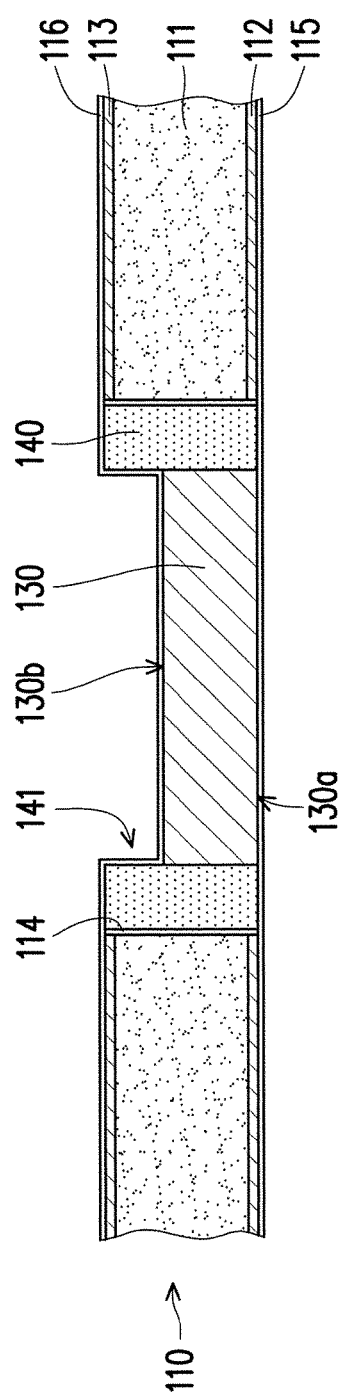

With reference to FIG. 8 and FIG. 9, the first copper capping layer 115 and the second copper capping layer 116 are respectively formed on two opposite sides of the substrate 110. Specifically, the first copper capping layer 115 may cover the first conductive layer 112, the first surface 130a of the heat conducting element 130 located at the same side as the first conductive layer 112, and a surface of the first insulation material 140 which is co-planar with the first surface 130a. Besides, the second copper capping layer 116 may cover the second conductive layer 113, the second surface 130b of the heat conducting element 130 located at the same side as the second conductive layer 113, a surface of the first insulation material 140 which is co-planar with the second conductive layer 113, and the first insulation material 140 defining the cavity 141. After said manufacturing steps are completed, the finished structure shown in FIG. 8 is rotated by 180 degrees for performing subsequent manufacturing steps.

Figure 10:
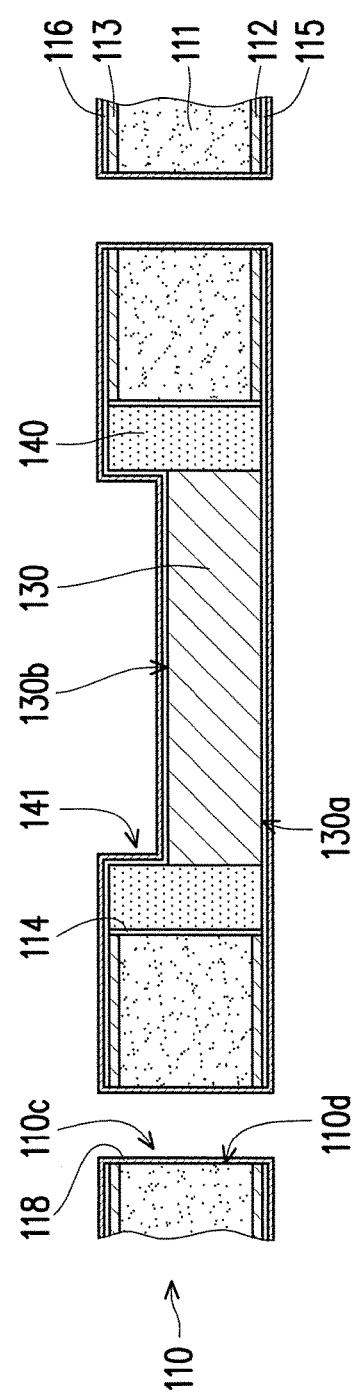
Figure 11:
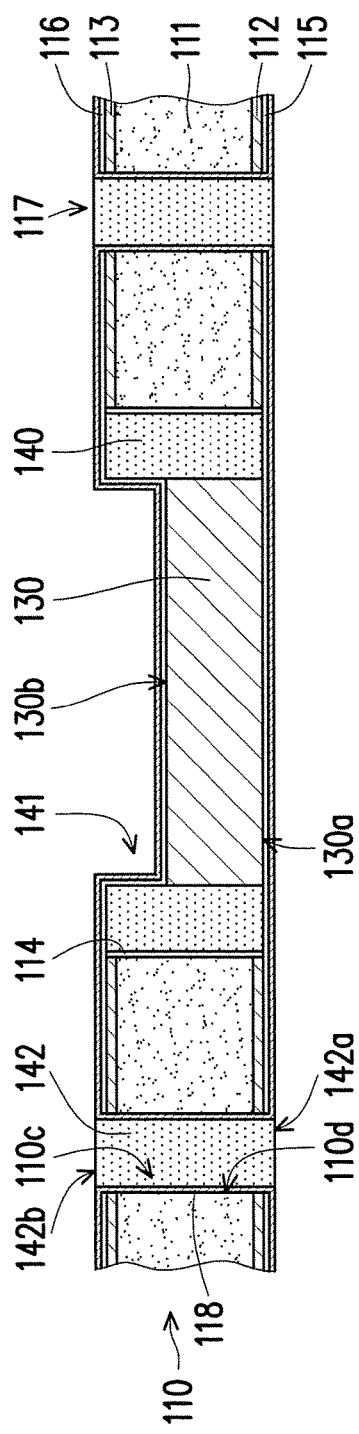

With reference to FIG. 10 and FIG. 11, at least one conductive through hole 117 (two conductive through holes 117 are schematically shown) may be selectively formed, and the detailed manufacturing steps are provided below. A portion of the core layer 111, the first conductive layer 112, and the second conductive layer 113 may be removed through laser processing, mechanical processing, or in a different manner, so as to form at least one via hole 110c passing through the substrate 110. In the drawings, two via holes 110c are schematically illustrated. A fourth conductive layer 118 may be formed on an inner side surface 110d of the via hole 110c through electroplating, deposition, or the like. Here, the fourth conductive layer 118 is connected to the first conductive layer 112 and the second conductive layer 113. According to the present embodiment, the fourth conductive layer 118 may further cover the first copper capping layer 115 and the second copper capping layer 116 and may be made of copper, aluminum, gold, nickel, other metallic materials, or alloy. The at least one via hole 110c is filled with the second insulation material 142, and the fourth conductive layer 118 surrounds the second insulation material 142. The second insulation material 142 has a first end portion 142a and a second end portion 142b opposite to each other. The first end portion 142a is co-planar with the fourth conductive layer 118 on the first copper capping layer 115, and the second end portion 142b is co-planar with the fourth conductive layer 118 on the second copper capping layer 116. So far, the fabrication of the conductive through hole 117 is substantially completed.

Figure 12:
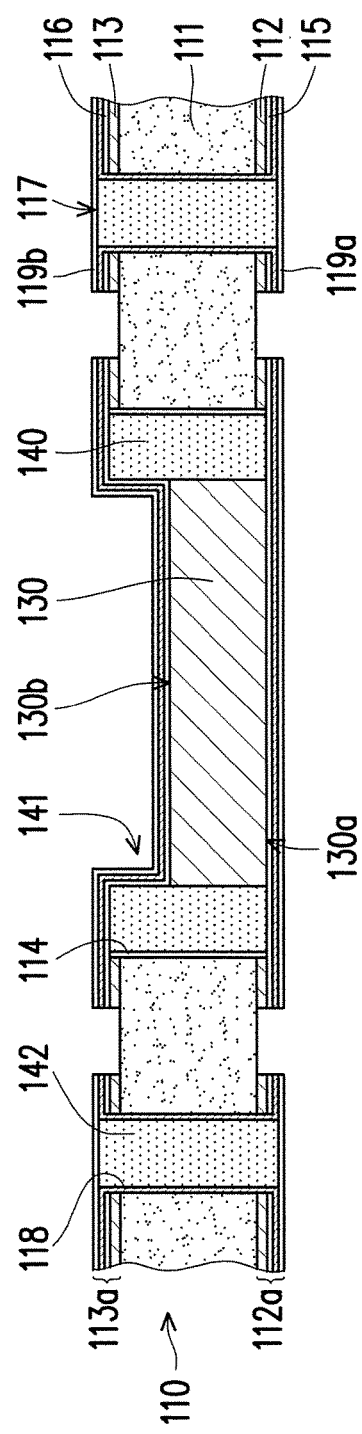

With reference to FIG. 12, a third copper capping layer 119a and a fourth copper capping layer 119b are respectively formed on two opposite sides of the substrate 110. The third copper capping layer 119a may cover the first conductive layer 112 and the first end portion 142a of the second insulation material 142. In particular, the third copper capping layer 119a covers the fourth conductive layer 118 on the first copper capping layer 115. The fourth copper capping layer 119b may cover the second conductive layer 113 and the second end portion 142b of the second insulation material 142. In particular, the fourth copper capping layer 119b covers the fourth conductive layer 118 on the second copper capping layer 116.

The first conductive layer 112 and the second conductive layer 113 are patterned through exposure and development, so as to respectively form the first patterned circuit layer 112a and the second patterned circuit layer 113a. The first patterned circuit layer 112a may be connected to the second patterned circuit layer 113a through the conductive through hole 117. Specifically, in the process of patterning the first conductive layer 112 and the second conductive layer 113, a portion of the third copper capping layer 119a, a portion of the fourth conductive layer 118, a portion of the first copper capping layer 115, and a portion of the first conductive layer 112 are removed, and so are a portion of the fourth copper capping layer 119b, a portion of the fourth conductive layer 118, a portion of the second copper capping layer 116, and a portion of the second conductive layer 113. Thereby, a portion of the core layer 111 is exposed.

Figure 13:
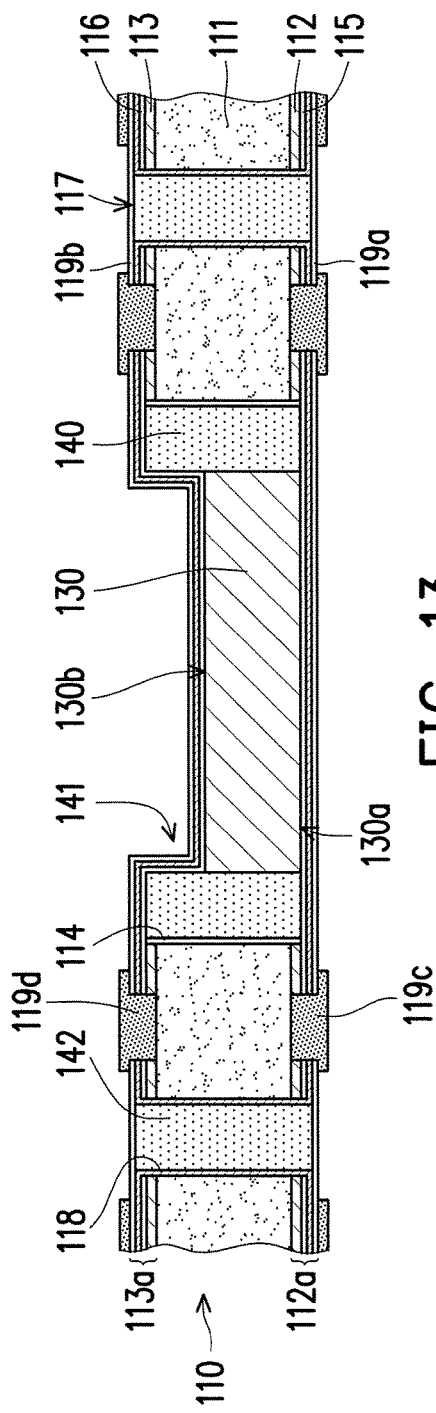
Figure 14:
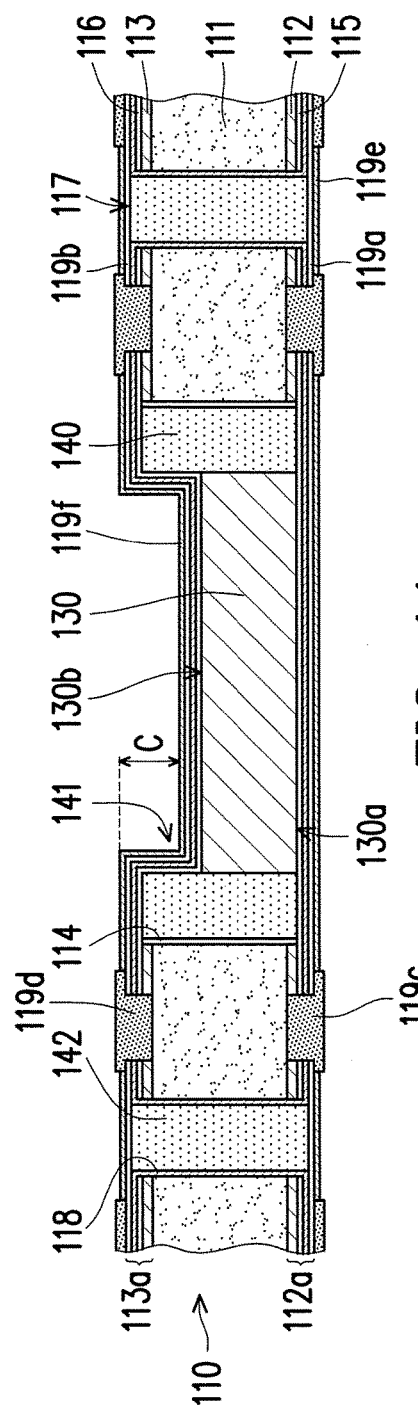

With reference to FIG. 13, a first solder resist layer 119c and a second solder resist layer 119d are respectively formed on a portion of the first patterned circuit layer 112a and a portion of the second patterned circuit layer 113a. The first solder resist layer 119c covers the core layer 111 exposed by the first patterned circuit layer 112a, and the second solder resist layer 119d covers the core layer 111 exposed by the second patterned circuit layer 113a. With reference to FIG. 14, a first surface treatment layer 119e and a second surface treatment layer 119f are respectively formed on a portion of the first patterned circuit layer 112a and a portion of the second patterned circuit layer 113a, i.e., on the portion of the first patterned circuit layer 112a not covered by the first solder resist layer 119c and on the portion of the second patterned circuit layer 113a not covered by the second solder resist layer 119d. The first surface treatment layer 119e and the second surface treatment layer 119f may be made of palladium, gold, nickel, silver, other appropriate metallic materials, or alloy. So far, the fabrication of the package carrier 100 is substantially completed.

According to the present embodiment, the heat conducting element 130 of the package carrier 100 is embedded in the core layer 111, and therefore the overall thickness of the package carrier 100 is reduced. Besides, during the process of fixing the heat conducting element 130 into the heat conducting channel 110a, the buffer layer 131 connected to the heat conducting element 130 can be removed while tearing away the adhesion layer 120, such that the cavity 141 not filled by the first insulation material 140 is left in the heat conducting channel 110a. That is, while the cavity 141 is being formed, it is not necessary to remove a portion of the first insulation material 140 through laser processing or mechanical processing, and thus the depth and the flatness of the resultant cavity 141 can be accurately controlled. As such, the manufacturing method of the package carrier 100 provided herein can ensure satisfactory processing precision, improve the production efficiency, and reduce the production costs. Note that the depth C of the cavity shown in FIG. 14 is the difference in the height of the second surface treatment layer 119f above the second conductive layer 113 and the height of the second surface treatment layer 119f in the cavity 141, and thereby the electronic device can be embedded therein subsequently.

In the present embodiment, one heat conducting element 130 is embedded, and one cavity 141 corresponding to the heat conducting element 130 is formed. However, it should be mentioned that the number of the heat conducting element 130 and the number of the cavity 141 may be adjusted according to actual requirements.

Figure 15:
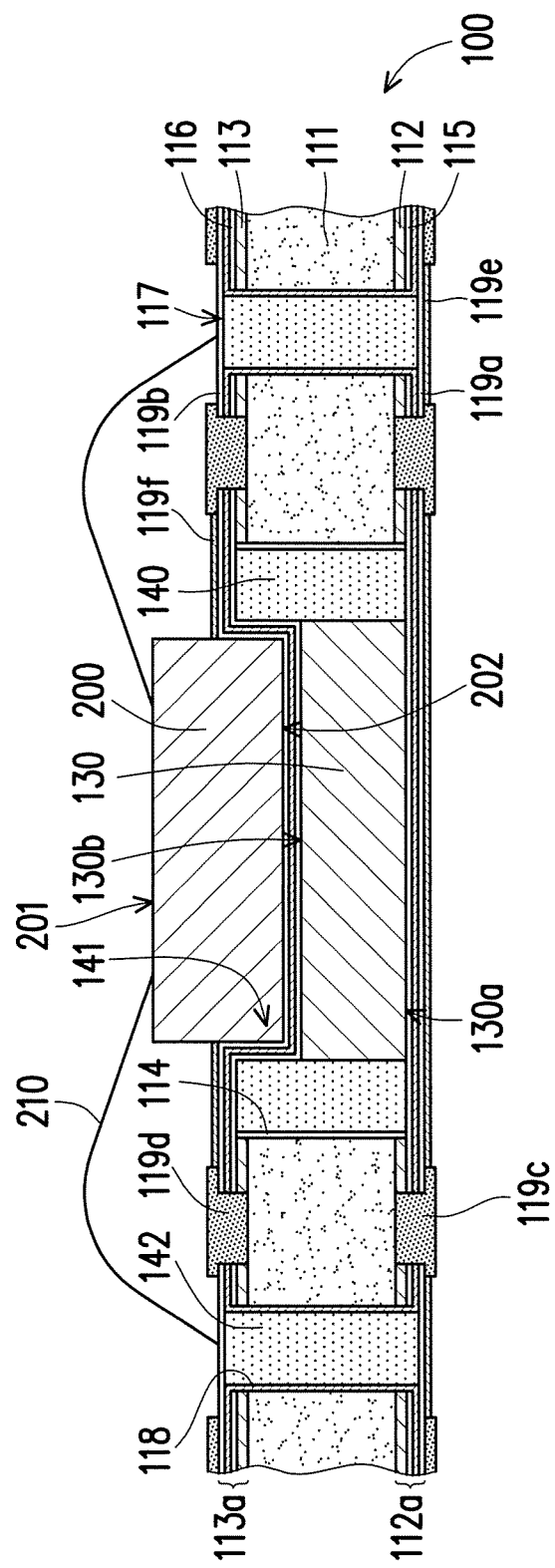
FIG. 15 is a schematic cross-sectional view illustrating that the package carrier depicted in FIG. 14 holds an electronic device.

FIG. 15 is a schematic cross-sectional view illustrating that the package carrier depicted in FIG. 14 holds an electronic device. With reference to FIG. 15, the electronic device 200 may be a chip having an active surface 201 and a back surface 202 opposite to the active surface 201. The back surface 202 of the electronic device 200 faces the cavity 141 and may be fixed onto the second patterned circuit layer 113a in the cavity 141 through surface mounting device (SMD) technology or with use of heat conducting adhesives. Here, the second surface treatment layer 119f in the cavity 141 may be selectively replaced by an organic solderability preservative (OSP). Since the bottom of the cavity 141 is horizontally lower than the second surface 111b of the core layer 111, the electronic device 200 fixed into the cavity 141 is partially exposed by the package carrier 100. In the present embodiment, the second patterned circuit layer 113a on the conductive through hole 117 is not covered by the second solder resist layer 119d, and the electronic device 200 may be connected to the active surface 201 and the second patterned circuit layer 113a on the conductive through hole 117 by wires 210 through wire bonding. Here, the second surface treatment layer 119f on the conductive through hole 117 may be selectively replaced by an OSP.

Thereby, the overall thickness of the package structure having the electronic device 200 and the package carrier 100 can be reduced, and the heat generated during the operation of the electronic device 200 can be rapidly dissipated from the package structure through the second patterned circuit layer 113a, the heat conducting element 130, the first patterned circuit layer 112a, and the first surface treatment layer 119e, thus achieving favorable heat dissipating effects.

Figure 16:
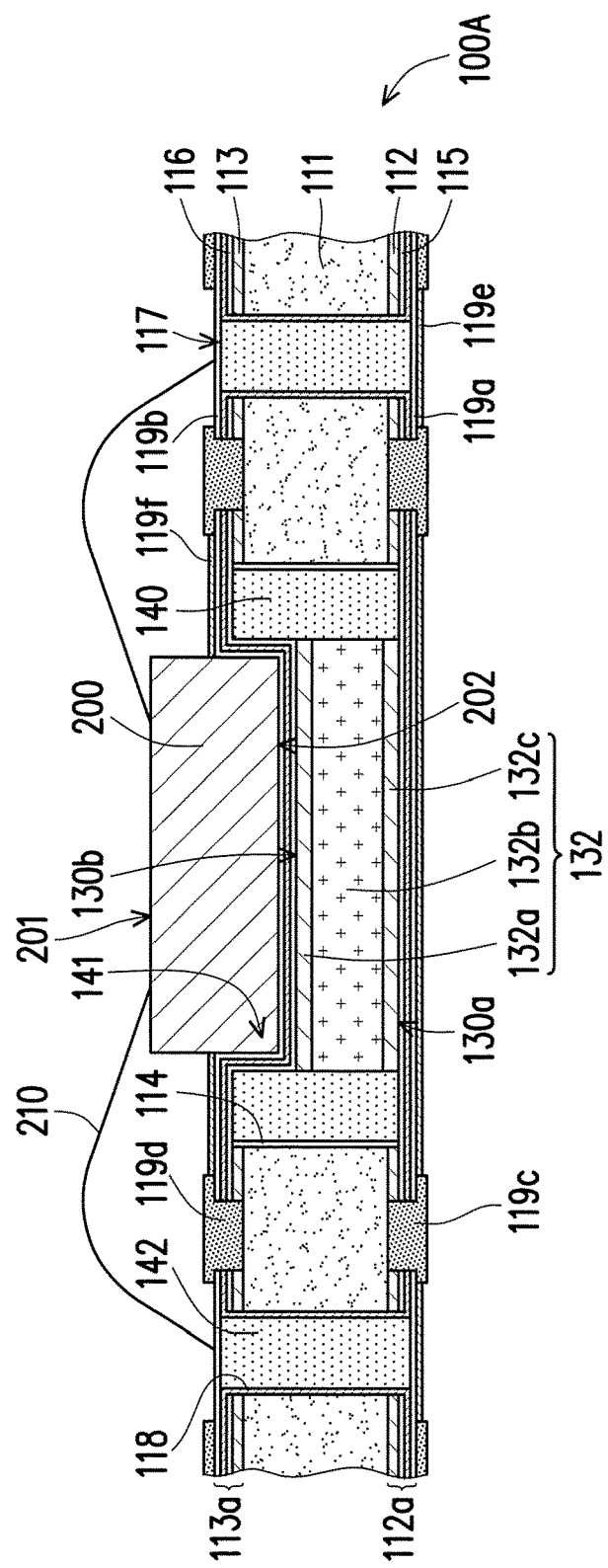
FIG. 16 is a schematic cross-sectional view illustrating that a package carrier holds an electronic device according to another embodiment of the invention.

FIG. 16 is a schematic cross-sectional view illustrating that a package carrier holds an electronic device according to another embodiment of the invention. With reference to FIG. 16, the package carrier 100A depicted in FIG. 16 is similar to the package carrier 100 depicted in FIG. 8, while the difference therebetween lies in that the heat conducting element 132 in the package carrier 100A may be constituted by three heat conducting layers 132a, 132b, and 132c, and the heat conducting layer 132b is located between the heat conducting layers 132a and 132c. The heat conducting layers 132a and 132c may be made of the same material, e.g., metal. The heat conducting layer 132b may be made of ceramics, for instance. The material of the heat conducting layers 132a and 132c is not limited to metal and may be ceramics, silicon, silicon carbide, or diamond-like carbon. The material of the heat conducting layer 132b is not limited to ceramics and may be metal, silicon, silicon carbide, or diamond-like carbon. Besides, there may be two, four, or more heat conducting layers in the heat conducting element 132, which should however not be construed as a limitation to the invention.

To sum up, in the package carrier provided herein, the heat conducting element is embedded in the core layer, and therefore the overall thickness of the package carrier is reduced. Besides, during the process of fixing the heat conducting element into the heat conducting channel, the buffer layer connected to the heat conducting element can be removed while tearing away the adhesion layer, such that the cavity being not filled by the first insulation material is left in the heat conducting channel. That is, while the cavity is being formed, it is not necessary to remove a portion of the first insulation material through laser processing or mechanical processing, and thus the depth and the flatness of the resultant cavity can be accurately controlled. As such, the manufacturing method of the package carrier provided herein can ensure satisfactory processing precision, improve the production efficiency, and reduce the production costs.

From another perspective, the package carrier may be configured to hold the electronic device (e.g., a chip, an active device chip, a radio frequency device chip, a light emitting diode chip, or an analog device chip) or any other heat generating device, which should however not be construed as a limitation to the invention. The electronic device is embedded in the cavity and is in direct or indirect contact with the heat conducting element. Therefore, the overall thickness of the package structure having the electronic device and the package carrier can be reduced, and the heat generated during the operation of the electronic device can be rapidly dissipated from the package structure through the second patterned circuit layer, the heat conducting element, the first patterned circuit layer, and the first surface treatment layer, thus achieving favorable heat dissipating effects.

It will be apparent to those skilled in the art that various modifications and variations can be made to the disclosed embodiments without departing from the scope or spirit of the invention. In view of the foregoing, it should be mentioned that the invention covers modifications and variations of this disclosure provided that they fall within the scope of the following claims and their equivalents.

What is claimed is:

1. A manufacturing method of a package carrier, the manufacturing method comprising:
   providing a substrate, the substrate comprising a core layer, a first conductive layer, and a second conductive layer, the first conductive layer and the second conductive layer being respectively disposed on two opposite sides of the core layer, the core layer having a first thickness;
   forming a heat conducting channel passing through the substrate;
   forming an adhesion layer on the second conductive layer, the adhesion layer covering a side of the heat conducting channel;
   placing a heat conducting element and a buffer layer connected to the heat conducting element into the heat conducting channel, wherein the buffer layer and the adhesion layer are in contact with each other, a gap is between an inner side surface of the core layer in the heat conducting channel and the heat conducting element and between the inner side surface of the core layer in the heat conducting channel and the buffer layer, the heat conducting element having a second thickness less than the first thickness;
   filling the gap with a first insulation material surrounding the heat conducting element and the buffer layer;
   removing the adhesion layer and the buffer layer, the heat conducting element and the first insulation material defining a cavity exposing the heat conducting element; and
   patterning the first conductive layer and the second conductive layer to respectively form a first patterned circuit layer and a second patterned circuit layer.

2. The manufacturing method according to claim 1, further comprising:
   forming a third conductive layer on the inner side surface of the heat conducting channel, the third conductive layer being connected to the first conductive layer and the second conductive layer, after forming the heat conducting channel passing through the substrate.

3. The manufacturing method according to claim 1, further comprising:
   forming a first copper capping layer and a second copper capping layer on two opposite sides of the substrate, after removing the adhesion layer and the buffer layer, defining the cavity by the heat conducting element and the first insulation material, and exposing the heat conducting element, respectively.

4. The manufacturing method according to claim 3, wherein the heat conducting element has a first surface and a second surface facing each other, the first surface and the first conductive layer are located at the same side, the first copper capping layer at least covers the first surface and the first conductive layer, the second surface is exposed by the cavity, the second surface and the second conductive layer are located at the same side, and the second copper capping layer at least covers the second surface and the second conductive layer.

5. The manufacturing method according to claim 1, further comprising forming at least one conductive through hole passing through the substrate, wherein the step of forming the at least one conductive through hole passing through the substrate comprises:
   forming at least one via hole passing through the substrate;
   forming a fourth conductive layer on an inner side surface of the at least one via hole, the fourth conductive layer being connected to the first conductive layer and the second conductive layer; and
   filling the at least one via hole with a second insulation material, the fourth conductive layer surrounding the second insulation material.

6. The manufacturing method according to claim 5, further comprising:
   forming a third copper capping layer and a fourth copper capping layer on the two opposite sides of the substrate, respectively, the third copper capping layer at least covering the first conductive layer and one end portion of the second insulation material, the fourth copper capping layer at least covering the second conductive layer and the other end portion of the second insulation material, after forming the at least one conductive through hole passing through the substrate.

7. The manufacturing method according to claim 1, further comprising:
   forming a first solder resist layer and a second solder resist layer on a portion of the first patterned circuit layer and a portion of the second patterned circuit layer, respectively, after patterning the first conductive layer and the second conductive layer to respectively form the first patterned circuit layer and the second patterned circuit layer.

8. The manufacturing method according to claim 7, wherein the first solder resist layer covers the core layer exposed by the first patterned circuit layer, and the second solder resist layer covers the core layer exposed by the second patterned circuit layer.

9. The manufacturing method according to claim 1, wherein a sum of a thickness of the heat conducting element and a thickness of the buffer layer is greater than or equal to a depth of the heat conducting channel.

10. The manufacturing method according to claim 1, wherein a material of the heat conducting element comprises ceramics, silicon, silicon carbide, diamond-like carbon, metal, or a combination thereof.

11. The manufacturing method according to claim 1, further comprising:

forming a first surface treatment layer and a second surface treatment layer on a portion of the first patterned circuit layer and a portion of the second patterned circuit layer, respectively, after patterning the first conductive layer and the second conductive layer to respectively form the first patterned circuit layer and the second patterned circuit layer.

12. The manufacturing method according to claim 1, wherein the heat conducting element comprises at least two heat conducting layers stacked with each other, and the two heat conducting layers are made of different materials.

13. The manufacturing method according to claim 1, further comprising:

forming at least one conductive through hole passing through the substrate, before patterning the first conductive layer and the second conductive layer to respectively form the first patterned circuit layer and the second patterned circuit layer.

* * * * *